United States Patent [19]

Kitayama et al.

[11] Patent Number: 5,107,522
[45] Date of Patent: Apr. 21, 1992

[54] AUTOMATIC FREQUENCY CONTROL CIRCUIT

[75] Inventors: Takamitsu Kitayama, Tenri; Masao Miyazaki, Nara; Tomozo Ohta, Ikoma, all of Japan

[73] Assignee: Sharp Kabushiki Kaisha, Osaka, Japan

[21] Appl. No.: 650,016

[22] Filed: Feb. 4, 1991

[30] Foreign Application Priority Data

Feb. 5, 1990 [JP] Japan .................................... 2-26750
Feb. 22, 1990 [JP] Japan .................................... 2-42137
Feb. 22, 1990 [JP] Japan .................................... 2-42138

[51] Int. Cl.⁵ ............................................. H04L 27/06
[52] U.S. Cl. ...................................... 375/97; 455/256; 455/265
[58] Field of Search ..................... 375/75, 97, 120; 455/182, 209, 256, 265; 328/134; 358/158

[56] References Cited

U.S. PATENT DOCUMENTS

| | | | |
|---|---|---|---|
| 4,641,325 | 2/1987 | Hughes | 375/97 |
| 4,696,056 | 9/1987 | Morita | 455/209 |
| 4,827,488 | 5/1989 | Shibano | 375/97 |
| 4,879,728 | 11/1989 | Tarallo | 375/97 |
| 4,947,409 | 8/1990 | Raith et al. | 455/256 |

FOREIGN PATENT DOCUMENTS

61-182317 8/1986 Japan .

Primary Examiner—Stephen Chin

[57] ABSTRACT

An AFC circuit stabilizes the frequency of an intermediate frequency signal to be applied to a demodulation circuit. A frequency conversion circuit responds to a local oscillation signal generated from a voltage-controlled oscillation circuit to convert the frequency of a digital modulation signal and applies the converted frequency to the demodulation circuit. A carrier reproduction circuit in the demodulation circuit reproduces the carrier of the intermediate frequency signal to output a synchronizing detection signal. The frequency of the reproduced carrier is frequency-divided by a frequency dividing circuit. A frequency division output thereof is counted by a counter for a definite period. Data is outputted from a microprocessor in response to a count output of the counter and the synchronizing detection signal, and the data is then converted into an AFC voltage by a D/A converter. The converted voltage is supplied as a control voltage to the voltage-controlled oscillation circuit. A stable intermediate frequency signal can be obtained by frequency-dividing the frequency of the carrier and counting the frequency division output thereof.

8 Claims, 7 Drawing Sheets

AUTOMATIC FREQUENCY CONTROL CIRCUIT

BACKGROUND OF THE INVENTION

1. Field of the Invention

The present invention relates generally to automatic frequency control circuits (hereinafter referred to as AFC circuits), and more particularly, to an AFC circuit in which the frequency of a frequency-converted digital modulation signal to be supplied as an input to a demodulation circuit is stabilized.

2. Description of the Background Art

For demodulation of a digital modulation signal which is modulated by a digital signal, in general, an AFC circuit is employed in order to enhance demodulation characteristics of a demodulation circuit, particularly bit error rate characteristics. The AFC circuit serves to suppress various frequency fluctuations and stabilize a center frequency of a digital modulation signal to be supplied as an input to the demodulation circuit.

FIG. 1 is a block diagram showing one example of a conventional AFC circuit. With reference to FIG. 1, a frequency conversion circuit 1 includes an input band-pass filter (BPF) 101, a mixer 102, an IF band-pass filter 103 and an IF amplifier 104. Input band-pass filter 101 is supplied with a digital modulation signal received through an antenna. Input band-pass filter 101 serves to band-limit the applied digital modulation signal, to apply the band-limited signal to mixer 102. Mixer 102 mixes the digital modulation signal with a local oscillation signal applied from a voltage-controlled oscillator (VCO) 309, which will be described later, included in an AFC circuit 3, to supply an intermediate frequency signal as an output to IF band-pass filter 103. IF band-pass filter 103 band-limits the applied intermediate frequency signal, to supply the band-limited signal to IF amplifier 104. IF amplifier 104 amplifies the intermediate frequency signal, to apply the amplified signal to a demodulation circuit 2.

Demodulation circuit 2 includes a band-pass filter 201 for band-limitation, a phase detector 202 and a carrier reproduction circuit 203. Band-pass filter 201 limits the band of the intermediate frequency signal, which is a digital modulation signal, to improve a carrier-to-noise ratio (C/N) and enhance demodulation characteristics. The band-limited intermediate frequency signal is applied to phase detector 202 and then multiplied by carrier $f_L$ supplied as an input from carrier reproduction circuit 203, so that the digital modulation signal is demodulated. In the example shown in FIG. 1, the digital modulation signal is an example of a quadrature four phase modulation signal, in which two signals I and Q orthogonal to each other are demodulated as demodulation signals. Carrier reproduction circuit 203 synchronizes the carrier with the center frequency of the digital modulation signal in response to the demodulated two signals I and Q, to apply a synchronizing detection signal 306 serving as a determining signal for determining synchronization nonsynchronization to AFC circuit 3.

AFC circuit 3 includes a frequency divider 301, a reference oscillator 302, a phase comparator 303, a microprocessor 307, a D/A converter 308 and VCO 309. Frequency divider 301 serves to 1/A frequency-divider the digital modulation signal that has passed band-pass filter 201 in demodulation circuit 2. A frequency division output of frequency divider 301 is applied to phase comparator 303. Phase comparator 303 is supplied with a reference frequency signal by reference oscillator 302. Phase comparator 303 compares in phase the digital modulation signal, which is frequency-divided by frequency divider 301, and the reference frequency signal, to supply an error signal as an output. More specifically, phase comparator 303 supplies as an output an error signal 304 of plus (+) when the phase of the digital modulation signal is in advance of that of the reference frequency signal, and conversely the comparator supplies an error signal 305 of minus (−) when the phase of the digital modulation signal is delayed from that of the reference frequency signal. Error signals 304 and 305 applied from phase comparator 303 and synchronizing detection signal 306 applied from carrier reproduction circuit 203 of demodulation circuit 2 are applied to microprocessor 307. Microprocessor 307 applies data corresponding to error signals 304 and 305 and synchronizing detection signal 306 to D/A converter 308. D/A converter 308 converts the applied data into an analog signal, to supply an AFC voltage to VCO 309.

A description will now be given on an operation of the conventional AFC circuit shown in FIG. 1. First, if synchronizing detection signal 306 supplied as an output from carrier reproduction circuit 203 is at the level representing nonsynchronization, microprocessor 307 makes the data to be applied to D/A converter 308 variable. D/A converter 308 converts the variable data into an analog voltage, to supply the converted voltage to VCO 309. VCO 309 sweeps a frequency in response to the variable voltage, to supply the swept frequency to mixer 102. Mixer 102 sweeps a frequency in response to the signal from VCO 309, so that an output signal of frequency divider 301 varies. Phase comparator 301 compares in phase a digital modulation signal and a reference frequency signal. If carrier $f_L$ is synchronized with the digital modulation signal in the course that VCO 309 performs sweeping, carrier reproduction circuit 203 causes synchronizing detection signal 306 to attain the level representing synchronization. Accordingly, microprocessor 307 stops VCO 309 from sweeping and then controls VCO 309 so as to lower the oscillation frequency of VCO 309 in response to the (+) error signal of those two error signals 304 and 305 applied from phase comparator 303. Conversely, microprocessor 307 controls VCO 309 so as to make the oscillation frequency thereof higher in response to the (−) error signal.

As described above, microprocessor 307 controls VCO 309 via D/A converter 308 so that the frequency of the digital modulation signal to be applied to demodulation circuit 2 may be stable. In addition, in order to prevent the oscillation frequency of VCO 309 from being frequently altered when carrier $f_L$ is in synchronization with the digital modulation signal, an allowable error range is set in phase comparator 303, thereby suppressing the times that the oscillation frequency of VCO 309 is controlled, to suppress the frequency fluctuation of the reproduced carrier.

In the conventional AFC circuit shown in FIG. 1, since the digital modulation signal, which is applied as an input to phase comparator 303 and frequency-divided, has passed band-pass filter 201 for band limitation, the digital modulation signal is influenced by the characteristics of band-pass filter 201. Particularly, because of variations in phase characteristics and amplitude characteristics due to temperature variations, the digital modulation signal undergoes a phase modulation or amplitude modulation, so that the frequency of the frequency-divided digital modulation signal becomes higher or lower than the frequency which is inherently divider. This might cause an error in an error signal of phase comparator 303.

Further, a frequency division error occurs in an output of frequency divider 301 in the case of a low C/N ratio, thereby causing a frequency error. Since phase comparator 303 is employed as means for stabilizing a digital modulation signal, reference oscillator 302 becomes necessary, and also the structure of phase comparator 303 becomes complicated by the setting of the allowable error range. Moreover, in order to compress the expansion of a spectrum of the digital modulation signal, the digital modulation signal should finally be frequency-divided up to the frequency of approximately 10 kHz. If the frequency of the digital modulation signal is 100 MHz or more, the frequency must be divided by 10000 or more, resulting in the disadvantage that the number of stages of frequency divider 301 increases. In addition, there is another disadvantage that jitter is produced in the frequency-divided signal, thereby causing an adverse effect when a phase comparison is made by phase comparator 303.

SUMMARY OF THE INVENTION

A principal object of the present invention is therefore to provide an AFC circuit having a simple structure and implementable in lower cost.

Another object of the present invention is to provide an AFC circuit in which a digital modulation signal to be applied to a demodulation circuit can be made stable on a frequency basis, and a reproduced carrier can also be made stable without an influence caused by temperature characteristics of circuit elements.

The present invention is directed to an AFC circuit in which the frequency of an intermediate frequency signal to be applied to a demodulation circuit is stabilized. In the AFC circuit, a frequency conversion circuit converts the frequency of a digital modulation signal, to supply an intermediate frequency signal as an output. A carrier reproduction circuit included in the demodulation circuit reproduces the carrier of the intermediate frequency signal, to supply as an output a synchronizing detection signal of the carrier. A frequency dividing circuit divides the frequency of the reproduced carrier. A counter counts a frequency division output of the frequency dividing circuit for a definite period. A control circuit supplies a control voltage to a voltage-controlled oscillation circuit in response to a count output of the counter and the synchronizing detection signal. The voltage-controlled oscillation circuit responds to the applied control voltage to vary the frequency of a local oscillation signal and then apply the varied signal to the frequency conversion circuit.

Therefore, in accordance with the present invention, when the carrier is in synchronization with the digital modulation signal, the voltage-controlled oscillator is subject to fine tuning. Thus, the AFC circuit can perform a stable operation without an influence caused by temperature characteristics of circuit elements in use since no jitter is produced in the frequency-divided signal. Thus, the AFC circuit in accordance with the present invention can require an extremely simple structure and can be manufactured in lower cost.

According to a preferred embodiment of the present invention, a control voltage is output as a digital signal from a microprocessor. This digital signal is converted into an analog signal by a D/A converter and then applied to a voltage-controlled oscillation circuit. Further, a count output of a counter is stored in a shift register and then serially applied to the microprocessor. The serial application of the count output enables a decrease in the number of terminals of the microprocessor.

Further, according to a more preferred embodiment of the present invention, a carrier-to-noise ratio of a digital modulation signal is detected, so that sweep speed of a control voltage to be applied to the voltage-controlled oscillation circuit is varied in accordance with the level of the detected carrier-to-noise ratio. Accordingly, when the carrier-to-noise ratio decreases, the sweep speed is reduced. When the carrier-to-noise ratio is higher, the carrier can be synchronized with the digital modulation signal earlier.

According to a further preferred embodiment of the present invention, as far as the digital modulation signal is asynchronous with the carrier, a switch is changed over to the digital modulation signal side, so that the digital modulation signal is applied to a frequency dividing circuit. If the digital modulation signal is close to a synchronization frequency of the carrier, the switch is changed over to the carrier side, so that the carrier is applied to the frequency dividing circuit.

Thus, in the case of nonsynchronization, the oscillation frequency of the voltage-controlled oscillation circuit can be swept at high speed by frequency-dividing of the digital modulation signal to count this frequency division output. When the carrier is close to a synchronization frequency, the switch is changed over. With the carrier frequency-divided, the voltage-controlled oscillator sweeps the oscillation frequency at low speed until the synchronization of the carrier is made. When the synchronization of the carrier is made, a signal obtained by frequency dividing of the carrier is counted for a definite period, so that the voltage-controlled oscillator is controlled so as to eliminate errors by the comparison between a count value thereof and a reference value.

According to a still further embodiment of the present invention, a control circuit is constituted by a PLL loop including a variable frequency-dividing circuit, a reference oscillation circuit, a phase comparison circuit and a microprocessor. The employment of the PLL loop achieves a more stable AFC circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
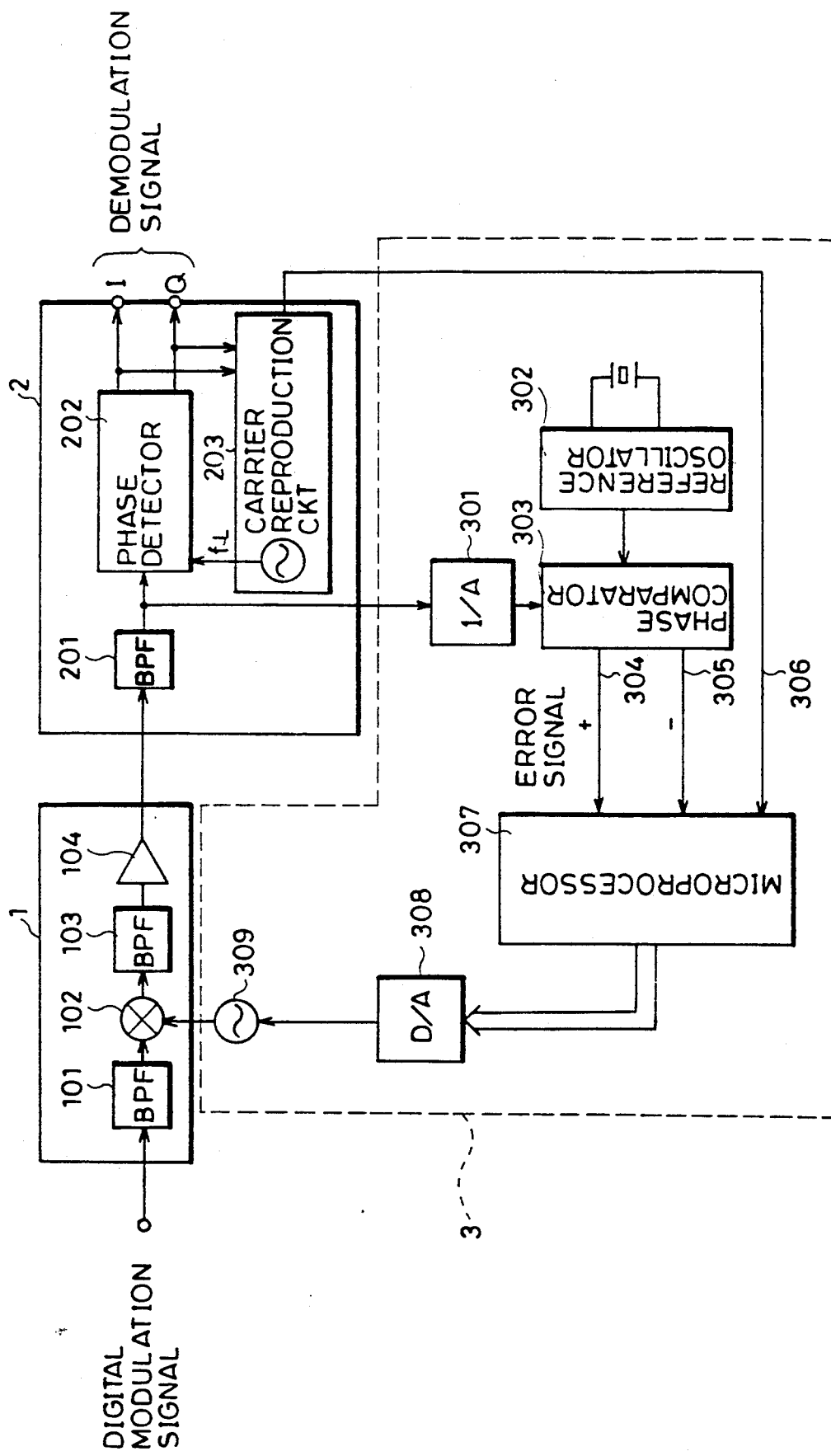
FIG. 1 is a schematic block diagram of a conventional AFC circuit.
Figure 2:
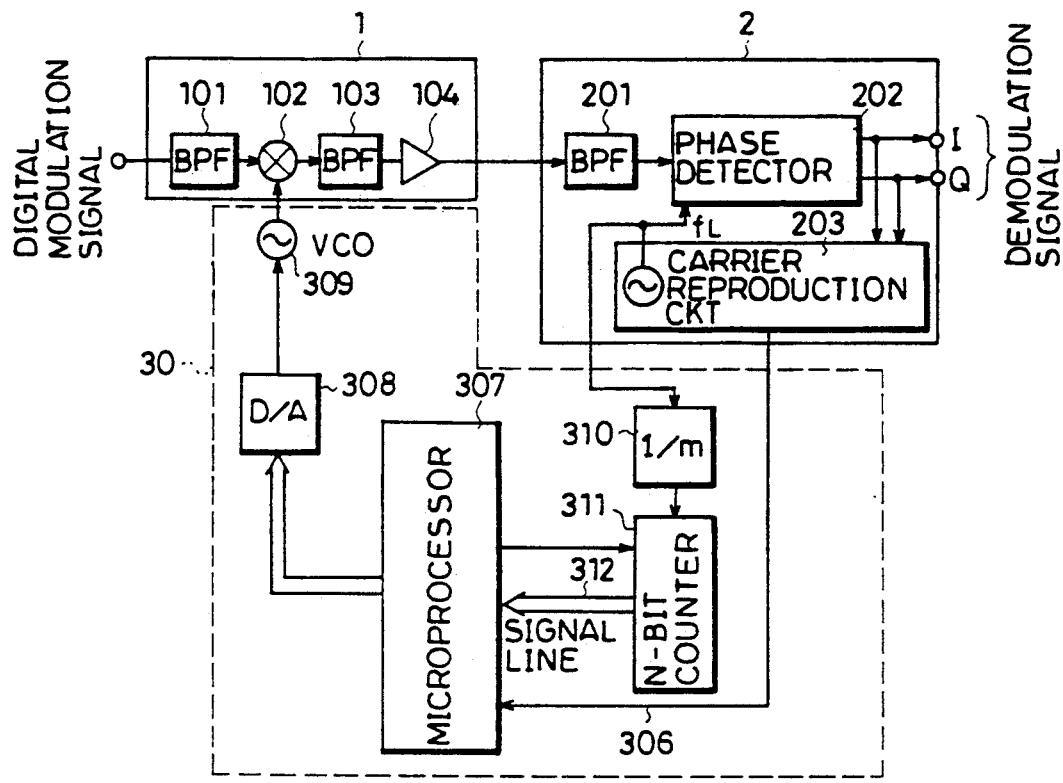
FIG. 2 is a schematic block diagram of one embodiment of the present invention.

FIG. 2 is a schematic block diagram of one embodiment of the present invention. The embodiment shown in FIG. 2 is different from FIG. 1 with respect only to an AFC circuit 30. A frequency conversion circuit 1 and a demodulation circuit 2 are structured similarly to those in FIG. 1. AFC circuit 30 includes a microprocessor 307, a D/A converter 308 and a VCO 309 as in FIG. 1, and also includes a frequency divider 310 and a counter 311. While frequency divider 301 shown in FIG. 1 serves to frequency-divide a digital modulation signal of an output of band-pass filter 201 for band limitation, the frequency divider of this embodiment of the present invention serves to m frequency-divide carrier $f_L$ supplied as an output by a carrier reproduction circuit 203 (where m≧2). A frequency division output of frequency divider 310 is applied to counter 311 of N bits and counted for a definite period therein. A count output 312 of counter 311 is applied to microprocessor 307. Microprocessor 307 controls data to be supplied as an output to D/A converter 308 in response to a count output applied to a signal line 312 and a synchronizing detection signal 306.

Figure 3:
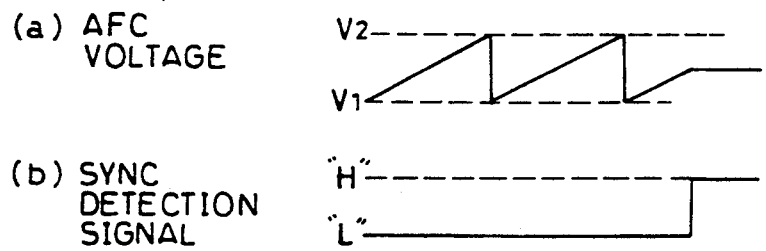
FIG. 3 is a diagram showing an example of an AFC voltage for explaining an operation of an AFC circuit shown in FIG. 2.

FIG. 3 is a waveform diagram of an AFC voltage generated in the AFC circuit shown in FIG. 2.

A description will now be given on an operation of the AFC circuit shown in FIG. 2 with reference to FIG. 3. First, if synchronizing detection signal 306 represents nonsynchronization at a logic low level as shown in FIG. 3 (b), microprocessor 307 varies an AFC voltage, to apply data for generating the sawtooth wave shown in FIG. 3(a) to D/A converter 308. D/A converter 308 converts the applied data into the sawtooth wave, to apply the converted data to VCO 309. VCO 309 sweeps the frequency of the sawtooth wave as the AFC voltage. As a result, a digital modulation signal supplied as an input to frequency conversion circuit 1 is frequency-converted while being swept similarly to the variation of the frequency by VCO 309. The frequency-converted digital modulation signal is supplied as an input to demodulation circuit 2. The swept digital modulation signal passes band-pass filter 201 for band limitation and then multiplied by the carrier $f_L$ supplied as an output from carrier reproduction circuit 203 in a phase detector 202, so that two signals I and Q are demodulated. These two signals are fed back to carrier reproduction circuit 203. When carrier $f_L$ is synchronized with the digital modulation signal, synchronizing detection signal 306 attains a logic high level to represent synchronization. When synchronizing detection signal 306 attains a logic high level, microprocessor 307 stops VCO 309 from sweeping the frequency.

Then, microprocessor 307 applies a control signal to counter 311 so as to operate counter 311 for a definite period to count the m frequency-divided carrier. After counting the m frequency-divided carrier for a definite period, counter 311 applies a count value thereof to microprocessor 307 via signal line 312. Microprocessor 307 compares the count value and the reference value set on a program and, if an error occurs, applies data to D/A converter 308 so as to eliminate the error. Thus, the oscillation frequency of VCO 309 is varied. Accordingly, the frequency of the digital modulation signal supplied as an input to demodulation circuit 2 is subjected to fine tuning and then stabilized, resulting in stabilization of the reproduced carrier.

As described above, this embodiment has such a feature that since the reproduced carrier $f_L$ is directly frequency-divided by frequency divider 310, a frequency division output can be accurately counted by counter 311 without the influence of the temperature characteristics caused by band-pass filter 201 nor without jitters produced in the frequency-demultiplied signal. Since the structure of the embodiment shown in FIG. 2 is extremely simple, the AFC circuit can be manufactured in lower cost.

When carrier $f_L$ output from carrier reproduction circuit 203 is in synchronization with the digital modulation signal, the times that the oscillation frequency of VCO 309 is altered is decreased, and the frequency fluctuation of the reproduced carrier $f_L$ is suppressed. Thus, when the comparison is made between the value obtained by counting of the frequency demultiplied carrier and the reference value, only the error exceeding an allowable error range should be corrected.

If the carrier $f_L$ is not counted continuously and repetitively but counted for a certain time, for example, at intervals of one second, the times that the oscillation frequency of VCO 309 is altered are further suppressed, so that the frequency of the digital modulation signal to be supplied as an input to demodulation circuit 2 can further be stabilized. Since the program of microprocessor 307 can cope with such an allowable error range, the allowable error range causes no influence on the circuit.

A description will now be made on a setting method employing actual numeric values. Assuming that an intermediate frequency signal of the digital modulation signal to be applied to demodulation circuit 2 is 140 MHz, the reproduced carrier $f_L$ is also 140 MHz. In order to prevent degradation of the C/N ratio, a synchronization range of this carrier $f_L$ is normally set to be smaller, for example, +/−1 MHz. Assuming that a frequency dividing ratio of frequency divider 310 is 1/40, and operation time of counter 311 is 2 msec, a count value of counter 311 is 7000, and resolution power by which carrier $f_L$ can be counted is 20 kHz. If the count value 7000 is represented by 1101101011000 bits in binary number, which is 13 bits.

Since the synchronization range of carrier $f_L$ is +/−1 MHz, the range of a count value +/−50 (=+/−110010 bits) should be acquired in counter 311, and hence counter 311 of 8 bits should be employed. Therefore, in the case of selecting counter 311, there is a degree of freedom for selecting a counter of 8-13 bits in the foregoing example. Such a method is also available that counter 311 of 12 bits is employed, and lower order 8 bits are input to microprocessor 307. If the operation time of counter is appropriately selected, a counter of 7 bits may be employed. As mentioned above, if the frequency dividing ratio of frequency divider 310 and the operation time of counter 311 are appropriately selected in consideration of the synchronization range of carrier $f_L$, the extremely simple structure of the AFC circuit can be provided.

While the repetitive waveform of the AFC voltage for sweeping VCO 309 is a sawtooth waveform as shown in FIG. 3(a), the repetitive waveform is not limited to this, and any waveforms such as a triangular waveform or sine waveform, which enable a smooth frequency sweeping of VCO 309, may be applied. Even if the level representing synchronization/nonsynchronization of synchronizing detection signal 306 is opposite to the level of the example shown in FIG. 3(b), this opposite level can be handled on a program, thereby causing no problem.

Figure 4:
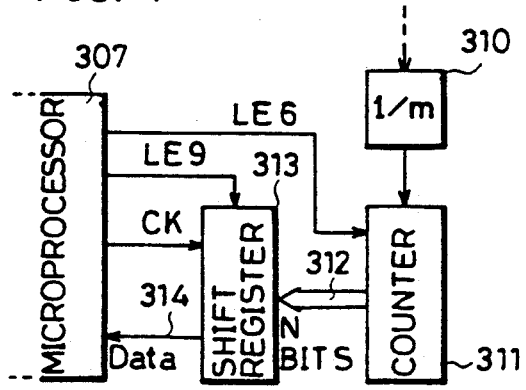
FIG. 4 is a diagram showing another example of a portion in which a count value of a counter shown in FIG. 2 is applied to a microprocessor.

FIG. 4 is a block diagram showing an embodiment for serially applying a count value of the counter to the microprocessor. In the foregoing example, the count value of counter 311 requires a signal line 312 of 7 bits at minimum, and hence microprocessor 307 requires 7 input terminals. In the embodiment shown in FIG. 4, however, a control signal LE9 is applied from microprocessor 307 to a shift register 313. A count output of counter 311 is stored via signal line 312 into shift register 313. A clock signal CK is output from microprocessor 307 to shift register 313. A count value is applied as serial data 314 to microprocessor 307. Accordingly, the number of the input terminals of microprocessor 307 can be reduced.

Figure 5:
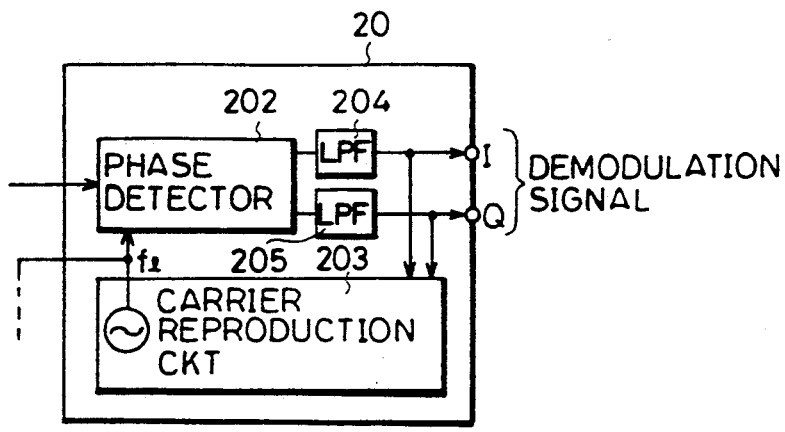
FIG. 5 is a block diagram showing another embodiment of the present invention.

FIG. 5 is a block diagram showing another embodiment of a demodulation circuit. A demodulation circuit 20 shown in FIG. 5 includes low-pass filters 204 and 205 for band limitation of a demodulated base band signal in place of band-pass filter 201 for band limitation shown in FIG. 2. In this case, according to the conventional example, since no band limitation of a digital modulation signal is made, a spectrum becomes wider, and jitters produced in a frequency divided signal become larger. Further, it is possible that the AFC circuit malfunctions by application of noises. In this embodiment, however, since the reproduced carrier is utilized, no adverse influence is provided.

Figure 6:
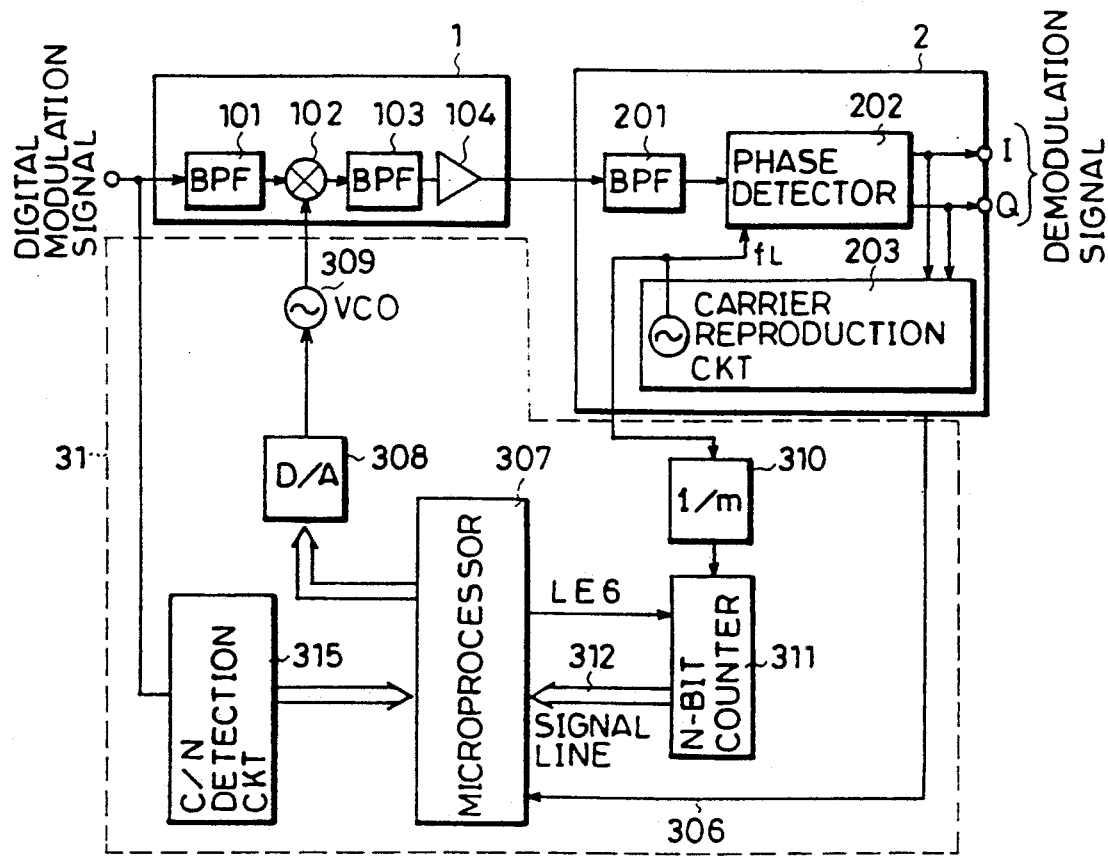
FIG. 6 is a schematic block diagram showing still another embodiment of the present invention.

FIG. 6 is a block diagram showing another embodiment of the present invention. In the embodiment shown in the foregoing example of FIG. 2, when the C/N ratio of the digital modulation signal is higher, the carrier $f_L$ output from carrier reproduction circuit 203 is synchronized with the digital modulation signal even if sweep speed of the sawtooth wave shown in FIG. 3(a) is higher. Conversely, when the C/N ratio thereof is lower, the carrier $f_L$ is not synchronized with the digital modulation signal until the sweep speed of the sawtooth wave is decreased. Thus, assuming in general that the C/N ratio of the digital modulation signal is decreased, the sweep speed is reduced. In the embodiment shown in FIG. 6, an AFC circuit 31 includes a C/N detection circuit 315. A digital modulation signal is applied to C/N detection circuit 315 by an input of a frequency conversion circuit 1, so that the C/N ratio of the applied digital modulation signal is detected. A detection output of C/N detection circuit 315 is a digital signal of several bits to be applied to microprocessor 307. Microprocessor 307 determines the level of the C/N ratio in response to the output of C/N detection circuit 315, to set sweep speed of a sawtooth wave corresponding to the determined level and thus control VCO 309. In case where the C/N ratio is higher, the carrier is synchronized with the digital modulation signal earlier than in the case where the sweep speed of the sawtooth wave is fixed. While an input of C/N detection circuit 315 is connected to the input of frequency conversion circuit 1 in the example shown in FIG. 6, the connection of the input of C/N detection circuit 315 is not limited to this, and the input thereof may be connected to an output of frequency conversion circuit 1 or an output of band-pass filter 201 in demodulation circuit 2.

Figure 7:
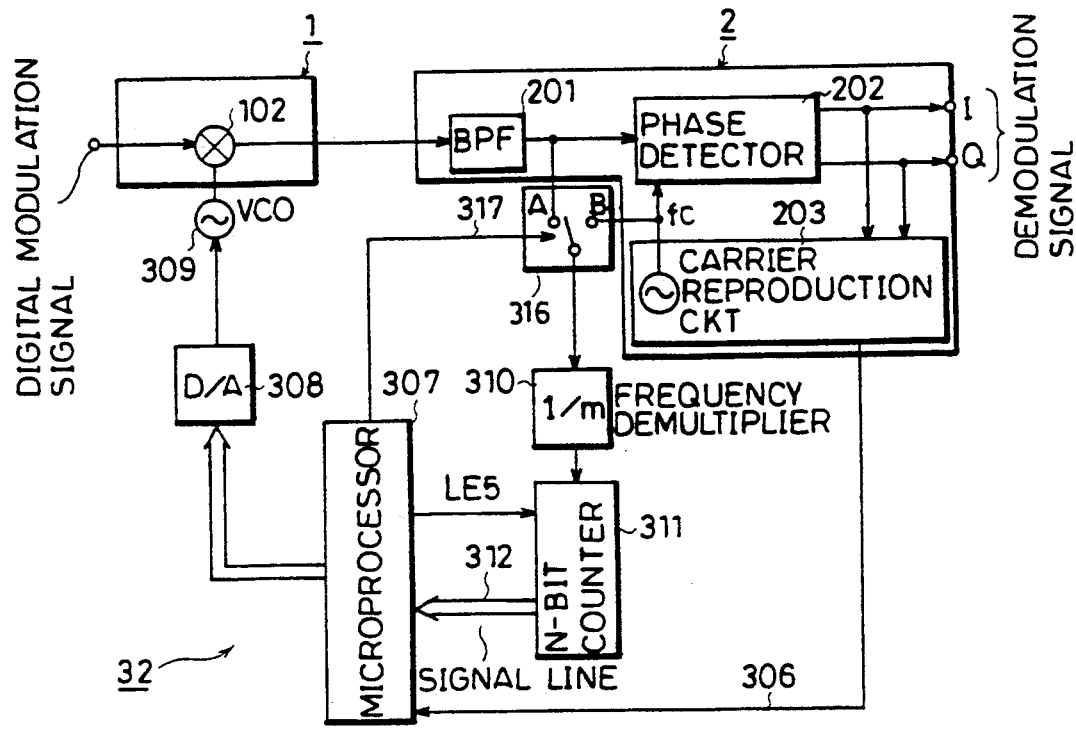
FIG. 7 is a schematic block diagram showing an embodiment in which an input of a frequency divider can be switched.

FIG. 7 is a block diagram showing still another embodiment of the present invention. The embodiment shown in FIG. 7 is structured in the same manner as the foregoing embodiment of FIG. 2 except for the following features. In FIG. 7, a frequency conversion circuit 1 only represents a mixer 102, and band-pass filter 101, IF band-pass filter 103 and IF amplifier 104 shown in FIG. 2 are omitted. An AFC circuit 32 includes a switch 316. This switch 316 is switched to one of terminals A and B in response to a control signal 317 supplied as an output from a microprocessor 307. Terminal A is connected to an output of a band-pass filter 201 for band limitation of a demodulation circuit 2, and terminal B is supplied with carrier $f_L$ supplied as an output from a carrier reproduction circuit 203. An output of switch 316 is supplied as an input to a frequency divider 310.

An operation of AFC circuit 32 shown in FIG. 7 will now be described. First of all, in case where the oscillation frequency of VCO 309 is swept at high speed when the carrier is not in synchronization with a digital modulation signal, switch 316 is switched to terminal A in response to control signal 317 from microprocessor 307. More specifically, switch 316 selects a band-limited digital modulation signal to apply the same to frequency divider 310. Frequency divider 310 m frequency-demultiplies the applied digital modulation signal, to supply a frequency division output thereof as an input to counter 311. Microprocessor 307 operates counter 311 for a definite period in response to a control signal LE5. Accordingly, counter 311 counts the frequency-divided digital signal. A count output of counter 311 is accepted via signal line 312 by microprocessor 307. Microprocessor 307 makes the comparison between a count value and a reference value set on the program. Microprocessor 307 then applies data to a D/A converter 308 so as to sweep the oscillation frequency of VCO 309 at high speed in the direction of eliminating the error between the reference value and the count value, thereby varying an AFC voltage of VCO 309.

At this time, assuming that the range of an intermediate frequency of the digital modulation signal to be applied to demodulation circuit 2 is 140 MHz +/−5 MHz, the resolution power of counting frequencies is 200 kHz, and a frequency dividing ratio of frequency divider 310 is 40 frequency dividing ratio, then the operation time of counter 311 is 0.2 msec, and the number of bits is 7-10 bits. When microprocessor 307 determines that the count value of the frequency-divided digital modulation signal is close to the synchronization frequency of the carrier, then microprocessor 307 causes switch 316 to be switched to terminal B, i.e., the side of the reproduced carrier $f_L$ being an output of carrier reproduction circuit 203, so as to sweep VCO 309 at low speed. When detecting, in response to synchronizing detection signal 306, that the carrier $f_L$ is synchronized with the digital modulation signal, microprocessor 307 stops the sweeping of VCO 309 to operate counter 311 for a definite period in response to a control signal LE5 so that the counter may count the frequency-divided carrier $f_L$.

A count output of counter 311 is accepted by microprocessor 307 via signal line 312 and then compared with the reference value set on the program. Microprocessor 307 applies data to D/A converter 308 in the direction of eliminating an error, so as to subject the oscillation frequency of VCO 309 to fine tuning. Accordingly, the frequency of the frequency-converted digital modulation signal to be applied to demodulation circuit 2 is stabilized. At this time, assuming that the resolution power required for counting the carrier $f_L$ is 20 kHz, the synchronization frequency range of the carrier $f_L$ is 140 MHz $+/-1$ MHz, and the operation time of counter 311 is 2 msec, then the count value of counter 311 is 6950-7050 since the frequency dividing ratio of frequency divider 310 is 40 frequency division. This count value is represented by 1101100100110 bits $-1101110001010$ bits in binary number, and the number of bits of counter 311 is 8-13 bits. Thus, the number of bits of counter 311 should be 8 bits which is the common number of bits in high speed sweeping.

As described above, if an appropriate setting is made on the frequency range of VCO 309, the synchronization frequency range of the carrier $f_L$, the resolution power of counting of frequencies in both high speed sweeping and low speed sweeping, the frequency dividing ratio of frequency divider 310 and the operation time of counter 311, then the number of bits of counter 311 can be minimized. While the switching of switch 316 is made upon low speed sweeping in the foregoing description, switch 316 may be switched after the carrier $f_L$ is synchronized with the digital modulation signal.

Figure 8:
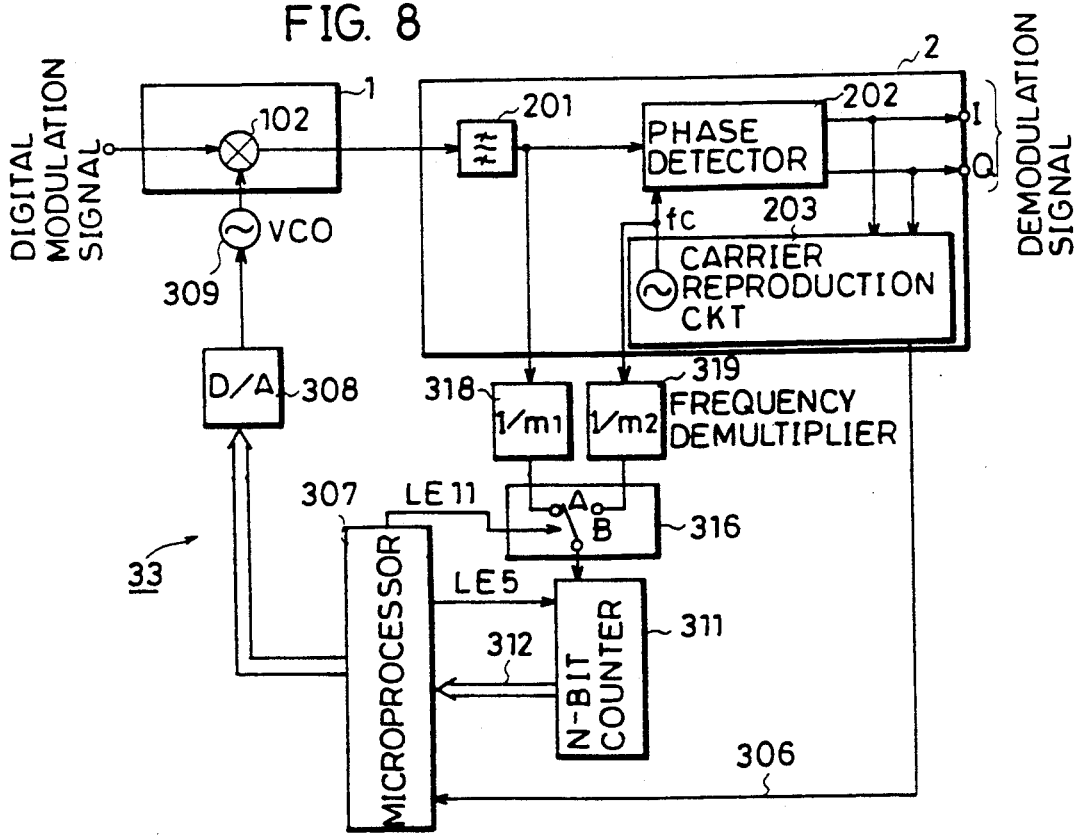
FIG. 8 is a schematic block diagram showing an embodiment in which an input of a counter can be switched.

FIG. 8 is a block diagram showing still another embodiment of the present invention. In the embodiment shown in FIG. 8, this AFC circuit includes a frequency divider 318 for m1 frequency dividing a digital modulation signal, and a frequency divider 319 for m2 frequency dividing carrier $f_L$. Respective outputs of these frequency dividers 318 and 319 are selected by switch 316 and then applied to counter 311. The rest of the structure of this embodiment is the same as that of the embodiment shown in FIG. 2. Switch 316 is switched in response to a control signal LE11 supplied as an output from microprocessor 307. An AFC operation in the embodiment shown in FIG. 8 is approximately the same as the operation of FIG. 7. The frequency dividing ratio of frequency divider 318 and that of frequency divider 319 may be identical to each other or different from each other. In both cases, the minimal number of bits of counter 311 can be employed if an appropriate setting is made on those frequency dividing ratios in accordance with the foregoing description and the various conditions given in the embodiment of FIG. 7.

Figure 9:
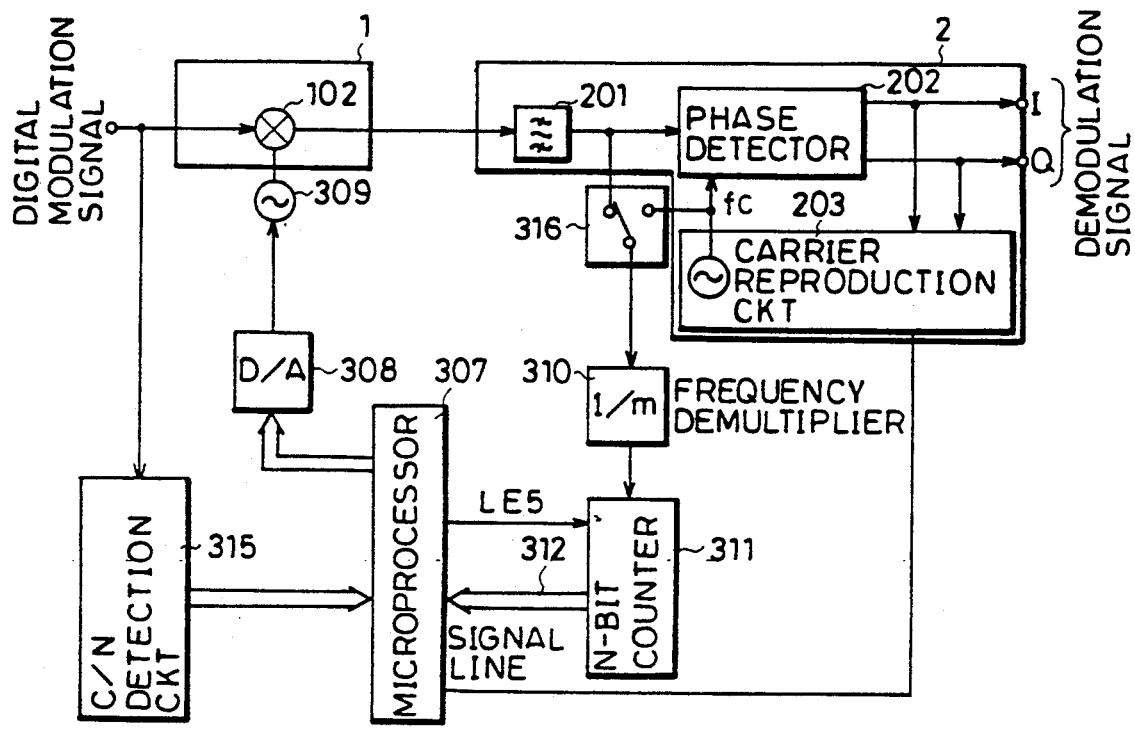
FIG. 9 is a schematic block diagram showing an embodiment in which a C/N detection circuit is provided.

FIG. 9 is a block diagram showing still another embodiment of the present invention. In the embodiment shown in FIG. 9, this AFC circuit includes C/N detection circuit 315 shown in FIG. 6 in addition to the embodiment shown in FIG. 7. Like the embodiment shown in FIG. 6, in the state that C/N detection circuit 315 is employed, the synchronization of carrier can be set earlier when the C/N ratio of a digital modulation signal is higher by a change of the sweep speed of a control voltage of VCO 309 based on the C/N ratio of the digital modulation signal.

Figure 10:
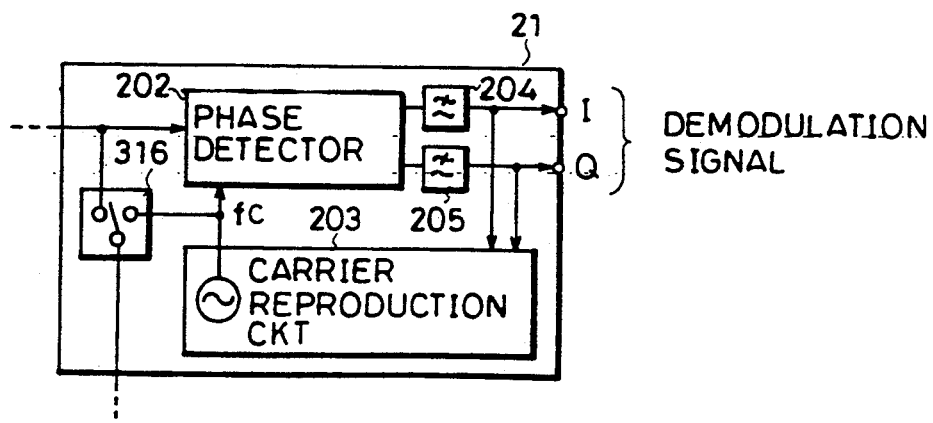
FIG. 10 is a block diagram showing another configuration of a demodulation circuit.

Referring to FIG. 10, band-pass filter 201 for band limitation of demodulation circuit 2 in the embodiments shown in FIGS. 6-9 is replaced by low-pass filters 204 and 205 for band limitation for band-limiting a demodulated signal. The characteristics of a demodulation circuit 21 are all the same as those of demodulation circuit 2 in the former embodiments. Even if demodulation circuit 21 for band-limiting the signal, produced by demodulating a digital modulation signal without placing a band limit, is employed, there is no trouble in an AFC operation because the digital modulation signal is utilized in high speed sweeping, and the carrier is directly frequency-divided to count frequencies in low speed sweeping and in the case of synchronization of the carrier, according to one embodiment of the present invention.

In this respect, in the conventional AFC circuit, since only a digital modulation signal is utilized, if the signal, produced by demodulating the digital modulation signal without placing a band limit, is band-limited after demodulation, the spectrum of the digital modulation signal to be applied to frequency divider 301 becomes wider than in the case of placing a band limit, and thus the jitters of the frequency-divided signal increase. Moreover, the C/N ratio of the digital modulation signal decreases by the proportion in which the digital modulation signal is not band-limited, resulting in an increase in the error from the carrier.

In the embodiments shown in FIGS. 6-9, like the embodiment of FIG. 4, shift register 313 may be provided between counter 311 and microprocessor 307, to serially apply a count output of counter 311 to microprocessor 307 and thus reduce the number of input terminals of microprocessor 307.

Figure 11:
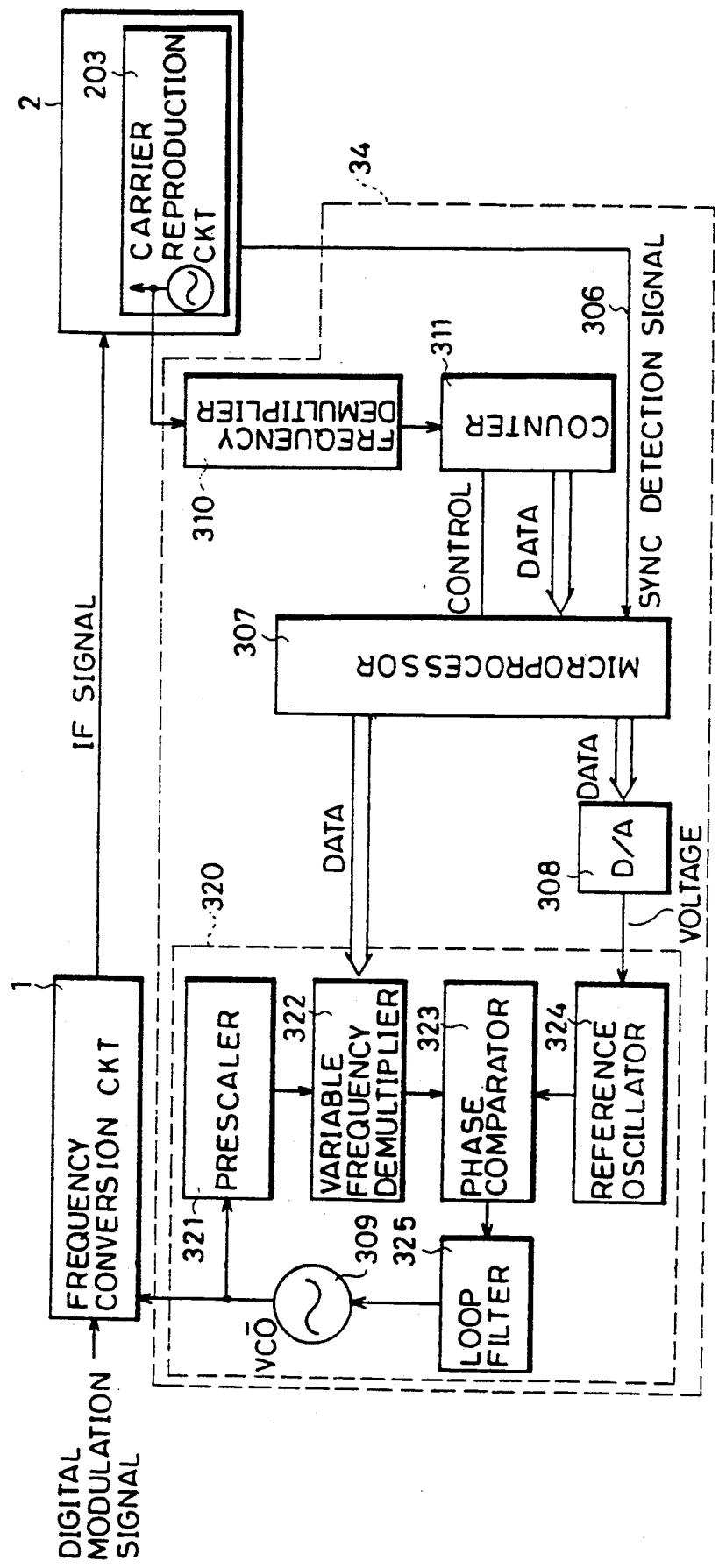
FIG. 11 is a schematic block diagram showing an embodiment in which a PLL circuit is employed.

FIG. 11 is a block diagram showing still another embodiment of the present invention. In the embodiment of FIG. 11, a PLL circuit 320 is employed as an AFC circuit 34. PLL circuit 320 includes a VCO 309, a prescaler 321, a variable frequency divider 322, a phase comparator 323, a reference oscillator 324 and a loop filter 325. VCO 309 applies a local oscillation signal to frequency conversion circuit 1 and also to prescaler 321. Prescaler 321 frequency-divides the frequency of the local oscillation signal in a predetermined frequency dividing ratio, to apply a frequency division output thereof to variable frequency divider 322.

Variable frequency divider 322 frequency-divides the local oscillation signal, which is frequency-divided by prescaler 321, in the frequency dividing ratio set by microprocessor 307. A frequency division output of variable frequency divider 322 is applied to phase comparator 323. Phase comparator 323 compares the phase of the frequency of the local oscillation signal, which is frequency-divided by variable frequency divider 322, with that of the frequency of a reference signal supplied as an output from reference oscillator 324, so as to supply an error signal as an output. The applied error signal is applied to loop filter 325, then smoothed and applied as a control voltage to VCO 309.

As reference oscillator 324, such a reference oscillator is employed as to be capable of controlling an oscillation frequency in response to an externally applied voltage. A control voltage of reference oscillator 324 is supplied in response to the conversion of digital voltage data applied from microprocessor 307 into an analog signal by D/A converter 308. The other devices in AFC circuit 34 such as a frequency divider 310, a counter 311, microprocessor 307 and D/A converter 308 are structured in the same manner as in FIG. 2.

Figure 12:
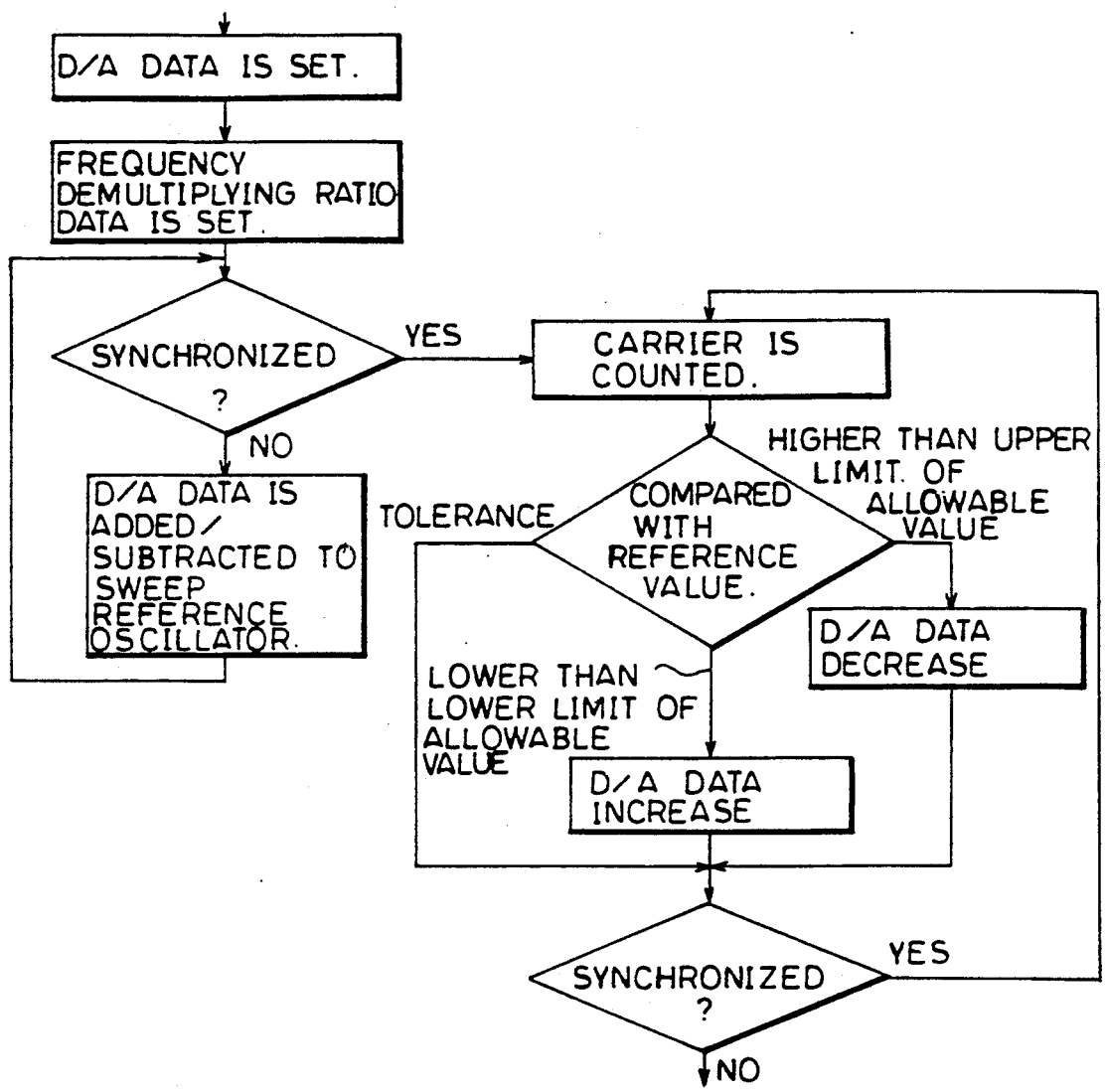
FIG. 12 is a flow chart for explaining an operation of the embodiment shown in FIG. 11.
Figure 13:
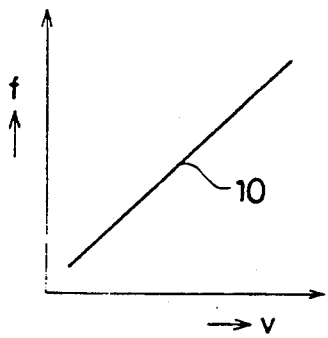
FIG. 13 is a diagram showing one example of voltage-to-frequency characteristics of the reference oscillator of FIG. 11.

FIG. 12 is a flow chart for explaining an operation of the embodiment shown in FIG. 11. FIG. 13 is a diagram showing one example of voltage-to-frequency characteristics of the reference oscillator of FIG. 11.

A detailed operation of this embodiment will now be described with reference to FIGS. 11-13. First, microprocessor 307 supplies as an output an initial value for determining an oscillation frequency of reference oscillator 324 of PLL circuit 320 to D/A converter 308. This applied data is converted into an analog signal by D/A converter 308, and the converted signal is then set as a voltage value in reference oscillator 324. Microprocessor 307 then sets previously stored frequency dividing ratio data in variable frequency divider 322. Then, PLL circuit 320 performs a predetermined PLL operation, so that a predetermined local oscillation signal is output from VCO 309, and a digital modulation signal applied to frequency conversion circuit 1 is frequency-converted into an IF signal. Microprocessor 307 makes a determination, in response to a synchronizing detection signal 306 supplied as an output from carrier reproduction circuit 203, as to whether or not carrier is synchronized with the frequency of the digital modulation signal. If the carrier is not in synchronization with the frequency of the digital modulation signal, data to be applied to D/A converter 308 is added/subtracted in order to sweep a reference frequency of reference oscillator 324. For example, if the waveform of sweeping is a sawtooth waveform, and the voltage-to-frequency characteristics of reference oscillator 324 is the one shown in FIG. 13, the data to be applied to D/A converter 308 is increased. More specifically, when the minimal value of the data is Nmin and the maximal value thereof is Nmax, the following relation is provided:

$$\rightarrow Nmin \rightarrow Nmax \rightarrow$$

In the above relation, such a loop should be set that the data is increased from the minimal value up to the maximal value and is then returned to the minimal value. When the waveform of sweeping is a triangular waveform, the following relation is provided likewise.

$$\rightarrow Nmin \rightarrow Nmax \rightarrow Nmin \rightarrow$$

In the above relation, such a loop should be set that the data is increased from the minimal value to the maximal valve and then decreased from the maximal value to the minimal value repetitively.

Microprocessor 307 determines synchronization detecting signal 306 supplied as an output from carrier reproduction circuit 203 and also repeats sweeping of reference oscillator 324 in the form of steps. When detecting that the carrier is synchronized with the frequency of the digital modulation signal, microprocessor 307 draws out from a loop of sweeping reference oscillator 324 and moves into a loop of counting the frequency of the carrier.

In this loop, the reproduced carrier supplied from carrier reproduction circuit 203 is first frequency-divider in a fixed frequency dividing ratio by frequency divider 310, so that the carrier which is frequency-divided by counter 311 is counted for a definite period. Microprocessor 307 accepts a count output of counter 311, to compare the same with a reference value set on a program. With such an allowable value as not to affect demodulation characteristics of demodulation circuit 2 set as a reference value, if a count value is within a tolerance, the times of controlling of reference oscillator 324 decrease, and drift on the steps of the IF signal can be reduced, resulting in an improvement in demodulation characteristics.

When the count value of counter 311 is within the tolerance, oscillation frequency of reference oscillator 324 does not have to be varied. When the count value is also lower than a lower limit of the allowable value, the data to be applied to D/A converter 308 is increased so as to make the oscillation frequency of reference oscillator 324 higher. Conversely, when the count value is higher than an upper limit of the allowable value, the data should be decreased. Thereafter, microprocessor 307 again determines whether or not the carrier is in synchronization with the frequency of the digital modulation signal. If the carrier is in synchronization with the frequency of the digital modulation signal, microprocessor 307 again returns to the loop of counting the frequency of the carrier. Conversely, if nonsynchronization is made, microprocessor 307 moves to another loop. For setting a frequency dividing ratio and data of a reference frequency in such an operation, the next operation can also take place after the frequency becomes stable. If the carrier is not in synchronization with the frequency of the digital modulation signal within the frequency variable range of reference oscillator 324, then the frequency dividing ratio of variable frequency divider 322 can be added/subtracted so as to re-sweep the oscillation frequency of reference oscillator 324.

As described above, according to the embodiment shown in FIG. 11, the frequency dividing ratio is set in variable frequency divider 322 of PLL circuit 320, and the oscillation frequency of reference oscillator 324 is swept. If the carrier reproduced by carrier reproduction circuit 203 is synchronized with the frequency of the digital modulation signal, the sweeping of reference oscillator 324 is stopped, so that the frequency of the directly reproduced carrier is counted. Then, fine tuning of the oscillation frequency of reference oscillator 324 enables stabilization of the frequency of the IF signal to be applied to demodulation circuit 2. Thus, even in the case of a low C/N ratio, the frequency can be accurately counted, and the frequency of the IF signal applied to demodulation circuit 2 can be stable, thereby enabling the frequency of the IF signal to more precisely match a normal frequency.

Figure 14:
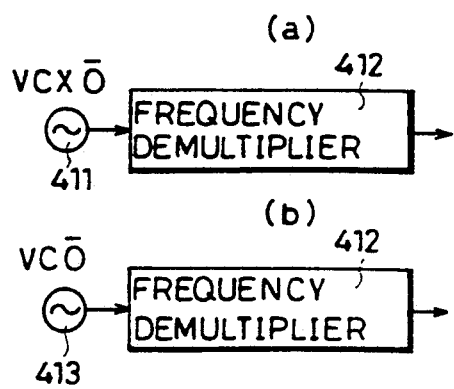
FIG. 14 is a diagram showing one example of reference oscillator 324 shown in FIG. 11.

FIG. 14 is a diagram showing one example of reference oscillator 324 shown in FIG. 11. Particularly, FIG. 14(a) shows reference oscillator 324 constituted by a voltage-controlled crystal oscillator (VCXO) 411 and a frequency divider 412, and FIG. 14(b) shows reference oscillator 324 constituted by a voltage-controlled oscillator (VCO) 413 and a frequency divider 412. Referring to FIG. 11, if the frequency fluctuation of a digital modulation signal is small, approximately ±0.01%, then VCXO 411 can be used in reference oscillator 324; however, if the frequency fluctuation becomes larger, then VCO 413 employing an SAW resonator in which a variable range can be taken wider, a ceramic resonator and the like should be employed.

As has been described heretofore, in the embodiment shown in FIG. 11, the employment of PLL circuit 320 for constituting AFC circuit 34 enables the stabilization of the frequency of the IF signal of the frequency-converted digital modulation signal to be applied to demodulation circuit 2. Thus, even in the case of a lower C/N ratio, an accurate counting of the frequency can be made, and the frequency of the IF signal applied to demodulation circuit 2 can be stable. Consequently, the frequency of the IF signal can more precisely match a normal frequency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An automatic frequency control circuit for stabilizing a frequency of an intermediate frequency signal to be supplied as an input to a demodulation circuit, comprising:
    frequency conversion means for frequency-converting a digital modulation signal to output an intermediate frequency signal;
    voltage-controlled oscillation means for applying a local oscillation signal having a varying oscillation frequency to said frequency conversion means in response to an applied control voltage;
    carrier reproduction means, included in the demodulation circuit, for reproducing a carrier of said intermediate frequency signal and for outputting a synchronizing detection signal of the carrier;
    frequency dividing means for frequency-dividing a frequency of the carrier reproduced by said carrier reproduction means;
    counting means for counting a frequency division output frequency-divided by said frequency dividing means for a definite period; and
    control means for applying said control voltage to said voltage-controlled oscillation means in response to a count output of said counting means and said synchronizing detection signal.

2. The automatic frequency control circuit according to claim 1, wherein said control means comprises:
    a microprocessor for converting a digital signal supplied as an output from said microprocessor into an analog signal and for applying the analog signal to said voltage-controlled oscillation means.

3. The automatic frequency control circuit according to claim 2, further comprising:
    register means for storing the count output of said counting means and for serially applying the stored count output to said microprocessor.

4. The automatic frequency control circuit according to claim 2, further comprising:
    detecting means for detecting a change in a carrier-to-noise ratio of said digital modulation signal;
    said microprocessor including means for generating said control voltage while sweeping said control voltage as a sawtooth wave and for changing speed of said sweeping in response to said detecting means detecting said change in the carrier-to-noise ratio.

5. The automatic frequency control circuit according to claim 2, further comprising:
    switch means for selecting one of said digital modulation signal and said reproduced carrier and for applying the selected one of said digital modulation signal and said reproduced carrier to said frequency dividing means;
    said microprocessor including means for determining a synchronizing state of said digital modulation signal and said carrier in response to the count output of said counting means and said synchronizing detection signal and for controlling said switch means so as to switch said switch means to said digital modulation signal in response to a determination of a nonsynchronization state and to switch said switch means to said carrier in response to a determination of a synchronization frequency of carrier.

6. The automatic frequency control circuit according to claim 2, wherein said frequency dividing means including,
    first frequency dividing means for frequency-dividing the frequency of said digital modulation signal, and
    second frequency dividing means for frequency-dividing the frequency of said reproduced carrier;
    said automatic frequency control circuit further comprising,
    switch means for selecting one of respective outputs of said first and second frequency dividing means and for applying the selected output to said counting means;
    said microprocessor including means for determining a synchronization state of said digital modulation signal and said carrier in response to the count output of said counting means and said synchronizing detection signal and for controlling said switch means so as to switch said switch means to an output of said first frequency dividing means in response to a determination of a nonsynchronization sate and to switch said switch means to an output of said second frequency dividing means in response to a determination of a synchronization frequency of carrier.

7. The automatic frequency control circuit according to claim 2, wherein said control means comprises:
    variable frequency dividing means, having a variable frequency dividing ratio, for frequency-dividing the local oscillation signal generated from said voltage-controlled oscillation means;
    reference oscillation means, having an oscillation frequency made variable by a voltage control, for generating a reference signal;
    phase comparison means for making a comparison between a phase of a frequency division output of said variable frequency dividing means and a phase of the reference signal generated from said reference oscillation means;
    said voltage-controlled oscillation means varying said oscillation frequency in response to a result of said comparison; and
    a microprocessor for setting voltage data for determining said oscillation frequency of said reference oscillation means, and for setting frequency dividing ratio data for determining the frequency dividing ratio of said frequency dividing means, for sweeping the voltage data applied to said reference oscillation means until a synchronizing detection signal is applied from said carrier reproduction means, and in response to the application of said synchronizing detection signal, for comparing the count output of said counting means and a predetermined reference value to subject the voltage data applied to said reference oscillation means to fine tuning so that a comparison output thereof may be in a predetermined range.

8. The automatic frequency control circuit according to claim 7, further comprising:
fixed frequency dividing means, having a fixed frequency dividing ratio, for frequency-dividing the local oscillation signal generated from said voltage-controlled oscillation means and for applying frequency division output thereof to said variable frequency dividing means.

* * * * *